United States Patent
Adusumilli et al.

(10) Patent No.: US 6,385,749 B1
(45) Date of Patent: *May 7, 2002

(54) METHOD AND ARRANGEMENT FOR CONTROLLING MULTIPLE TEST ACCESS PORT CONTROL MODULES

(75) Inventors: Swaroop Adusumilli, Tempe; James Steele, Chandler; David Cassetti, Tempe, all of AZ (US)

(73) Assignee: Koninklijke Philips Electronics N.V. (KPENV), Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 09/283,809

(22) Filed: Apr. 1, 1999

(51) Int. Cl.[7] .............................................. G01R 31/28
(52) U.S. Cl. ..................... 714/733; 714/30; 714/726; 714/727
(58) Field of Search ..................... 714/30, 720, 724, 714/726, 727, 729, 733; 370/241

(56) References Cited

U.S. PATENT DOCUMENTS

| 5,627,842 A | * | 5/1997 | Brown et al. ............... 714/727 |
| 5,708,773 A | * | 1/1998 | Jeppesen, III et al. ...... 714/730 |
| 6,073,254 A | * | 6/2000 | Whetsel ....................... 714/30 |

OTHER PUBLICATIONS

Whetsel, Lee, An IEEE 1149.1 Based Test Access Architecture For ICs With Embedded Cores, Texas Instruments.
IEEE Std 1149.1 (JTAG) *Testability Primer*, Texas Instruments, 1997 Semiconductor Group.
IEEE Std 1149.1–1990, IEEE Std Test Access Port and Boundary–Scan Architecture, IEEE Computer Society, Oct. 21, 1983.

* cited by examiner

*Primary Examiner*—Emmanuel L. Moise

(57) ABSTRACT

An arrangement controls an IC designed with multiple "core" circuits, such as multiple CPUs, with each core circuit including its own TAP controller. According to one example embodiment, multiple test-access port (TAP) controllers coupled to a common interface are controlled by adapting each TAP controller to receive input signals, determine if the TAP controller is enabled, and generate status signals and test signals. An output circuit responds to the TAP controllers by outputting one of the test signals respectively provided by the multiple TAP controllers, and a link module is used to maintain one of the TAP controllers enabled at a given time. The above-embodiment is useful, for example, in connection with IC applications that require an increasing number of core circuits without increasing the circuit area of the IC and/or the number of IC pins, and can be implemented to avoid changing existing structures of TAP controllers.

28 Claims, 7 Drawing Sheets

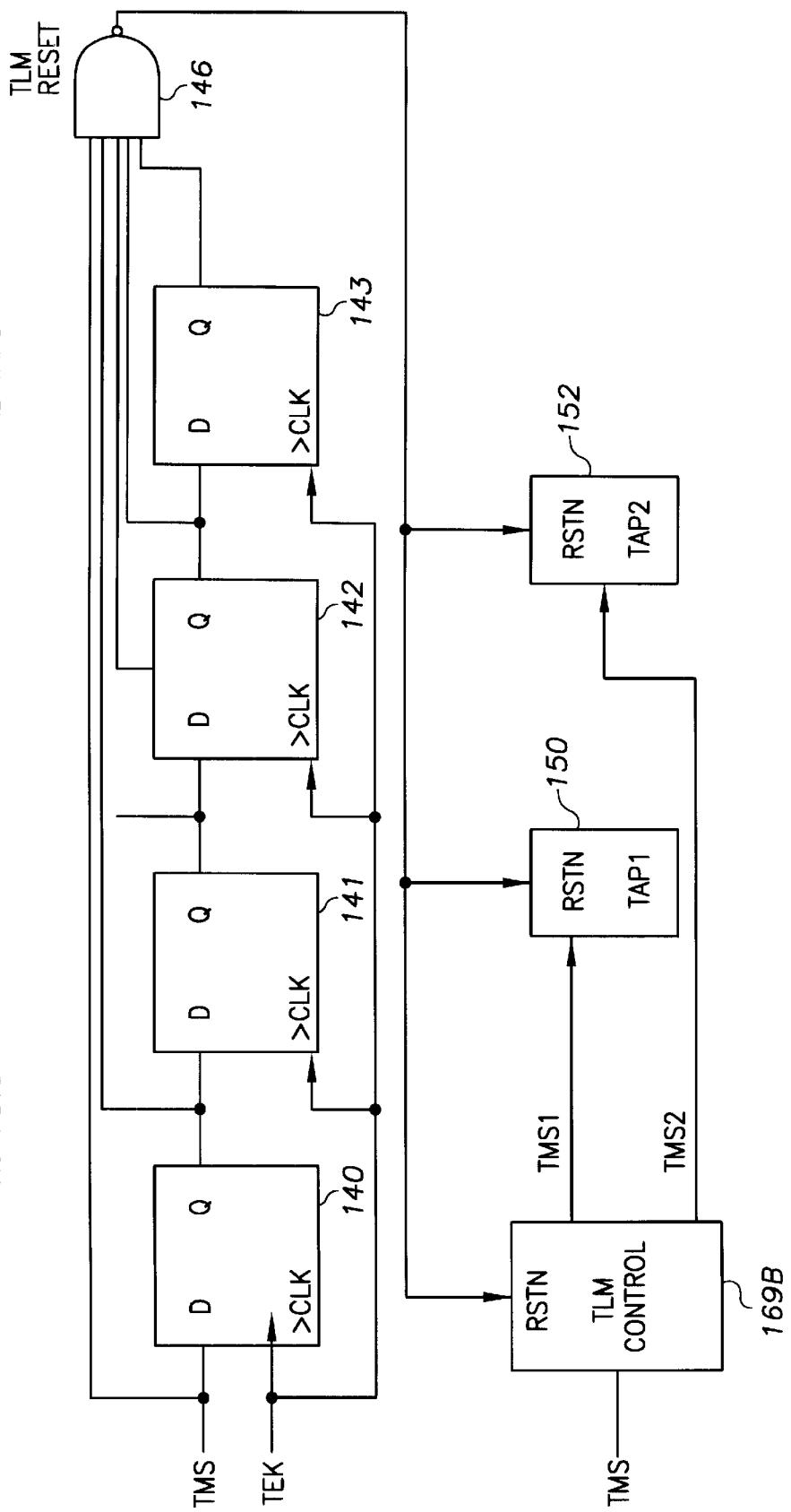
FIG. 4B     NO RESET PIN @ CHIP LEVEL AND RESET TO ALL INDIVIDUAL TAPS

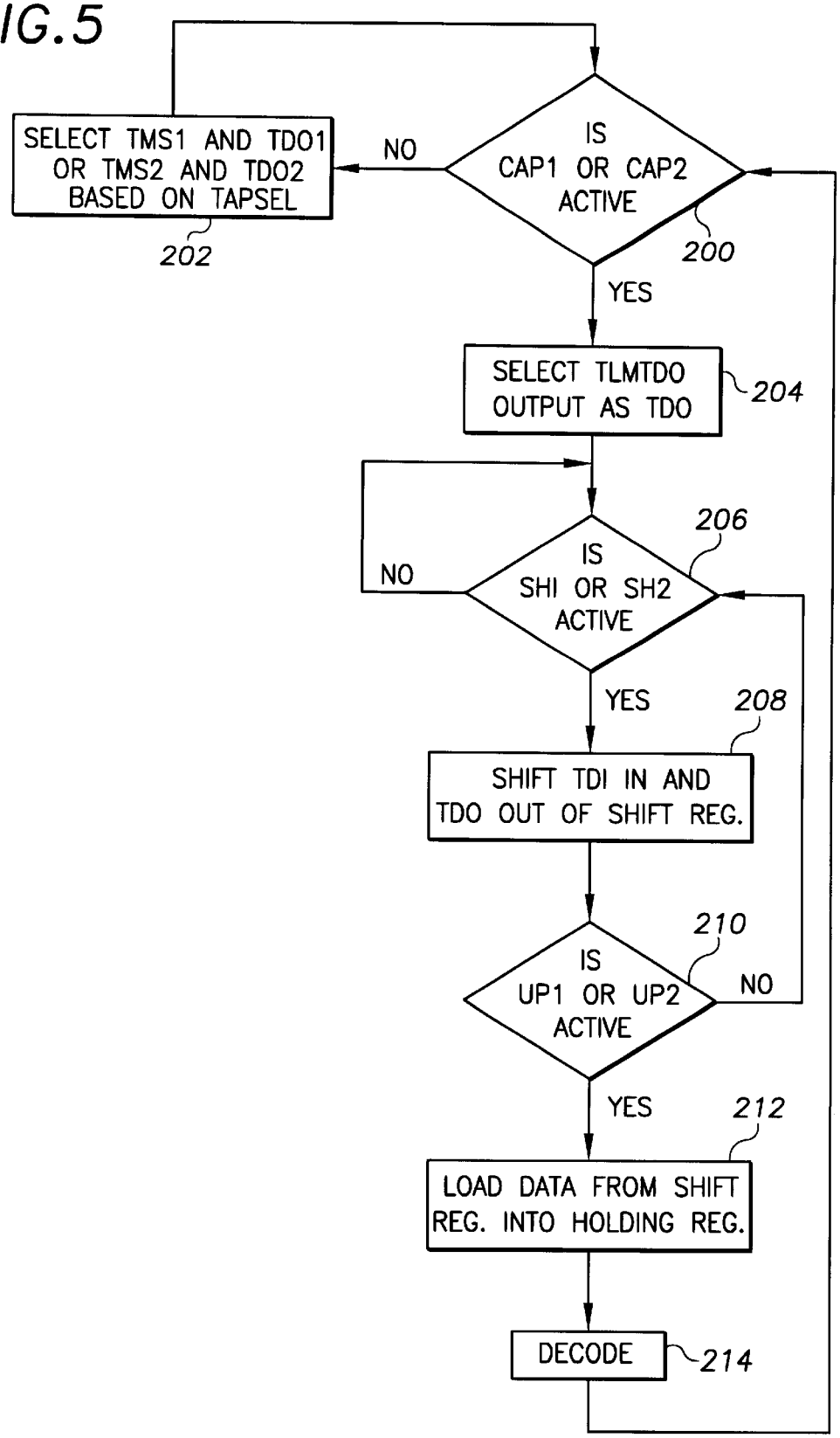

METHOD AND ARRANGEMENT FOR CONTROLLING MULTIPLE TEST ACCESS PORT CONTROL MODULES

FIELD OF THE INVENTION

The present invention relates generally to testing integrated circuits (ICs) and, more particularly, to IC test methods and arrangements involving multiple test access port controllers, such as used in connection with IEEE JTAG standards.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A wide variety of techniques have been used in IC devices to ensure that, once they are manufactured, they operate fully in compliance with their intended design and implementation specifications. Many of the more complex IC designs include circuits that permit in-circuit testing via the IC access pins. The IEEE 1149.1 JTAG recommendation, for example, provides a test circuit architecture for use inside such ICs. This architecture includes a test access port (TAP) controller coupled to the IC pins for providing access to and for controlling various standard features designed into such ICs. Some of these features are internal scan, boundary scan, built-in test and emulation.

The JTAG recommendation was developed with the understanding that such IC designs would be using only one test access port controller. Sometime after its initial development, however, many IC's are being designed with multiple "core" circuits, such as multiple CPUs, with each core circuit including its own TAP controller. Typically, separate IC pins are used to select one of the TAP controllers for testing and/or debugging the IC. This is problematic, however, in IC applications that require an increasing number of core circuits without increasing the circuit area of the IC and/or the number of IC pins.

One approach that attempts to overcome such difficulty involves use of an internally implemented circuit for selecting which of the TAP controllers is activated during a test/debug mode of operation inside the TAP controller itself. This approach requires a change to the existing structure of the TAP controllers so that special signals can be drawn from and fed to each TAP controller, and requires that each TAP controller have knowledge that it is enabled at a given time. For many applications, however, changing the design of the established TAP controller is expensive. Further, for certain applications, requiring that each TAP controller have knowledge that it is enabled at a given time adversely removes a desired degree of transparency.

For further information concerning with the above issues, reference may be made to an article entitled, "An IEEE 1149.1 Based Test Access Architecture for ICs with Embedded Cores," by Lee Whetsel, and to IEEE Std. 1149.1-1990, and 1149.1-1993, each of which is incorporated herein by reference.

SUMMARY

According to various aspects of the present invention, embodiments thereof are exemplified in the form of methods and arrangements for controlling an IC designed with multiple "core" circuits, such as multiple CPUs, with each core circuit including its own TAP controller. Such embodiments are useful in connection with IC applications that require an increasing number of core circuits without increasing the circuit area of the IC and/or the number of IC pins, and can be implemented to avoid changing existing structures of TAP controllers.

One specific implementation is directed to a circuit control arrangement for a multi-core IC having a limited number of access pins for selecting functions internal to the IC. The circuit control arrangement includes multiple test-access port (TAP) controllers and an output circuit. Each TAP controller couples to a common interface, receives input signals indicating if the TAP controller is enabled, and generates status and test signals. The output control circuit includes a TAP link module and is responsive to each of the multiple TAP controllers and configured and arranged to output one of the test signals respectively provided by the multiple TAP controllers. The TAP link module includes an output coupled to the input of each multiple TAP controller, provides the input signals and maintains one of the TAP controllers enabled at a given time.

A more specific implementation of the above circuit control arrangement, the TAP link module is adapted to respond to the status signal provided by each of the multiple TAP controllers by transitioning enablement between the TAP controllers and to signal to the output control circuit which one of the test signals respectively provided by the multiple TAP controllers to output.

In other more specific implementations, the common interface is compatible with an IEEE JTAG recommendation, and/or carries some or all of the JTAG-recommended interface signals and signal definitions.

Another aspect of the present invention is directed to a method for controlling multiple test-access port (TAP) controllers coupled to a common interface for a multi-core IC having a limited number of access pins for selecting functions internal to the IC. The method comprises: at each of the multiple TAP controllers, receiving input signals, determining if the TAP controller is enabled, and generating status and test signals; in response to each of the multiple TAP controllers, outputting one of the test signals respectively provided by the multiple TAP controllers; and at the input of each of the multiple TAP controllers, providing the input signals and for maintaining one of the TAP controllers enabled at a given time.

Yet another aspect of the present invention is directed to use in a multi-core IC having a limited number of access pins for selecting functions internal to the IC, with a circuit control arrangement in the IC comprising: multiple test-access port (TAP) controllers, each TAP controller configured and arranged to couple to a common interface, to receive input signals indicating if the TAP controller is enabled, and to generate status and test signals; a TAP link module coupled to the input of each multiple TAP controller, and configured and arranged to provide the input signals and to maintain one of the TAP controllers enabled at a given time, the TAP link module including: an input multiplexer arrangement for selecting a set of signals from the one of the TAP controllers that is enabled, an output multiplexer arrangement for feeding a TMS signal to the one of the TAP controllers that is enabled; and an output control circuit responsive to each of the multiple TAP controllers and to the TAP link module, the output control circuit configured and arranged to output one of the test signals respectively provided by the multiple TAP controllers.

Other aspects of the present invention are directed to alternative reset implementations for the TLM and TAP controllers, independent of the presence of a reset pin on each of the respective TAPs.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which:

FIGS. 4A through 4E illustrate alternative embodiments for resetting the TAP link controller and the multiple TAP controllers illustrated and described in connection with FIGS. 1–3; and FIG. 5 illustrates a flow chart of an example process for operating the arrangement of FIGS. 1 and 2.

Figure 1:
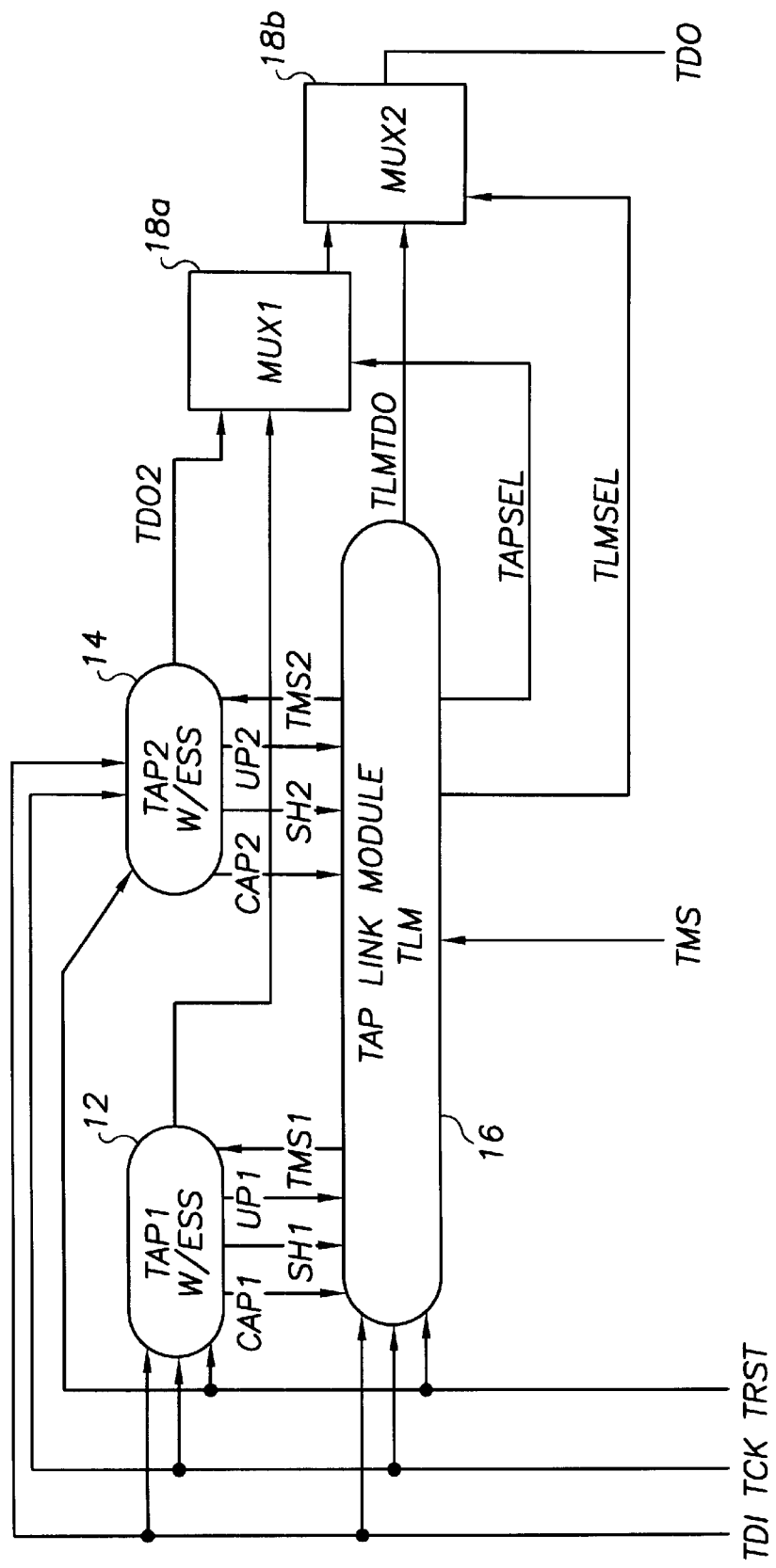
FIG. 1 illustrates a circuit control arrangement for use in a multi-core IC having multiple test-access port (TAP) controllers coordinated using a TAP link controller and having a limited number of access pins for selecting functions internal to the IC, according to one example embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of integrated circuit (IC) designs having two or more internal core circuits requiring control and/or coordination during a test/debug stage. The present invention has been found to be particularly advantageous for use in connection with ICs having two or more CPU cores, such the VVS3670 Multicore Development Chip, which includes the ARM and OAK DSP processors (available from VLSI Technology, Inc. of San Jose, Calif.). While the present invention is not so limited, an appreciation of various aspects of the invention may be obtained through a discussion of various application examples in such environments.

According to another example embodiment, the present invention provides a circuit control arrangement including multiple test-access port (TAP) controllers, an output control circuit and a TAP link module. Each controller has input/output (I/O) signals including input signals coupling to a JTAG interface, input signals sent from the TAP link module to indicate if the controller is be enabled, and an output test signal and a status signal indicative of the internal status of the controller. The output control circuit processes one of the output test signals in response to a select signal from the TAP link module, which in turn responds to the status signal for maintaining one of the multiple TAP controllers enabled at a given time.

In a more specific implementation, the TAP link module (TLM) is a separate functional block implemented to control and provide smooth switching between active TAP controllers in the same IC, and the TAP controller arrangement has two features. A first feature is the inclusion of at least one external scan chain support in at least one of the TAP controllers. External scan chain support is conventional on most re-usable CPU cores, and functions in such conventional manner in that the same core TAP controller controls the external scan chain around the PAD ring of a packaged device. Another feature, consistent with the IEEE 1149.1 recommendation, is that TAP controller arrangement ensures that at least one TAP controller is active at any given time.

In various embodiments, the TLM is implemented as a shift register, an update register, combinatorial logic, a separate TAP controller, another CPU circuit, and a combination of one or more of the above.

Turning now to the figures, FIG. 1 illustrates another specific example embodiment of the present invention. This embodiment includes a circuit control arrangement 10 used in a multicore IC having multiple test-access port (TAP) controllers 12 and 14. The TAP controllers 12 and 14 are coordinated using a TAP link module (TLM) 16. Not illustrated is the packaged IC having a limited number of access pins for selecting functions internal to the IC, including those functions associated with the arrangement of FIG. 1.

Each of the TAP controllers 12 and 14 includes external chain support. JTAG-recommended interface signals to the IC include TDI (test input) and TCK (test clock). These interface signals are fed to and received by each of the TAP controllers 12 and 14 and to the TLM 16. The JTAG-recommended interface signal TMS (test mode select) is also fed to and received by the TLM 16, and is used to control corresponding signals internally generated by the TLM 16. These signals, TMS1 and TMS2, are used to respectively control the TAP controllers 12 and 14, depending on which of the TAP controllers 12 and 14 is enabled at a given time. In addition, an optional signal referred to as TRST, may also be provided from one of the IC pins (or internally generated by a status, such as power-up condition) to functionally reset the TAP controllers 12 and 14 and the TLM 16. If the IC is implemented without a TRST access pin, one specific example approach to resetting the TAP controllers 12 and 14 and the TLM 16 is to implement the circuit control arrangement 10 of FIG. 1 so that one of the TAP controllers 12 and 14 is a unique default TAP controller operative at power-up to reset the other TAP controller(s), using for example the TMS, TCK signals and the TLM 16. Alternatively, without a TRST access pin, another approach to resetting the TAP controllers 12 and 14 and the TLM 16 is to implement the TLM 16 to direct one of the TAP controllers 12 and 14 as the default TAP controller operative at power-up be enabled, with the TLM 16 (or alternatively the default TAP controller) resetting the other TAP controller (s). Yet another alternative is to employ a separate power-up reset circuit similarly causing one of the TAP controllers to act as default-enabled controller, with output control directly and/or indirectly to each of the TAP controllers 12 and 14 and the TLM 16.

In another approach that is inconsistent with IEEE recommendations, none of the TAP controllers is automatically enabled at power up; rather one of the TAP controllers is selectively activated by inputting a signal via a dedicated access pin or via a unique combination of logic levels on a set of access pins that are generally used for other functions. While a circuit to detect this approach is not expressly illustrated in FIG. 1, a skilled artisan will recognize that any of the various types of above-discussed structures can be readily implemented in conjunction with the illustrated circuitry to provide such operation.

The circuit control arrangement 10 also includes output control circuitry for generating a TDO (test output signal) from the TDO generated by the enabled TAP controller (12 or 14). In the example illustration, the output control circuitry includes two multiplexers 18a and 18b that are arranged to pass the TDO generated by the enabled TAP controller, or the TDO generated by the TLM 16, to the output pin of the IC. Signals depicted as TAPSEL (for TAP select) and TLMSEL (for TLM select) respectively direct the multiplexers 18a and 18b to pass the TDO generated by the enabled TAP controller or the TDO generated by the TLM 16. It will be appreciated that the multiplexers 18a and 18b are depicted as functional operators and can be implemented using various structures including those listed above in connection with the discussion of implementations for the TLM 16.

With each of the TAP controllers 12 and 14 including external chain support, each of the TAP controllers supplies signals for evaluation or use external to the IC. These signals are capture clock (CAP), shift clock (SH) and update clock (UP). Capture clock is used to sample data in scan cells and is generated in a CAPTURE-DR state of the TAP state machine. Scan cells are analogous to circuit nodes internal to the IC and are used in conjunction with a scan path application to permit the behavior of an IC to be observed at its I/O boundaries for a given set of input data. The CAPTURE-DR state is one of several operational states of the TAP state machine. When the TAP controller is in this state, at a rising edge of TCK the controller enters one of two other states depending on the state of the TMS signal. These states and transitions are as characterized in IEEE Std. 1149.1-1990, and 1149.1-1993 (fully incorporated herein), and chapter five therein explains the operation of the TAP controller. Shift clock is used to shift data in scan cells and is generated in a SHIFT-DR state of the TAP state machine. Update clock is used to update the instruction register in the TLM 16 and is generated in an UPDATE-DR state of the TAP state machine. With these above signals and by controlling the TMS signal, the TLM 16 smoothly transitions enablement from one TAP controller to the next.

Figure 2:
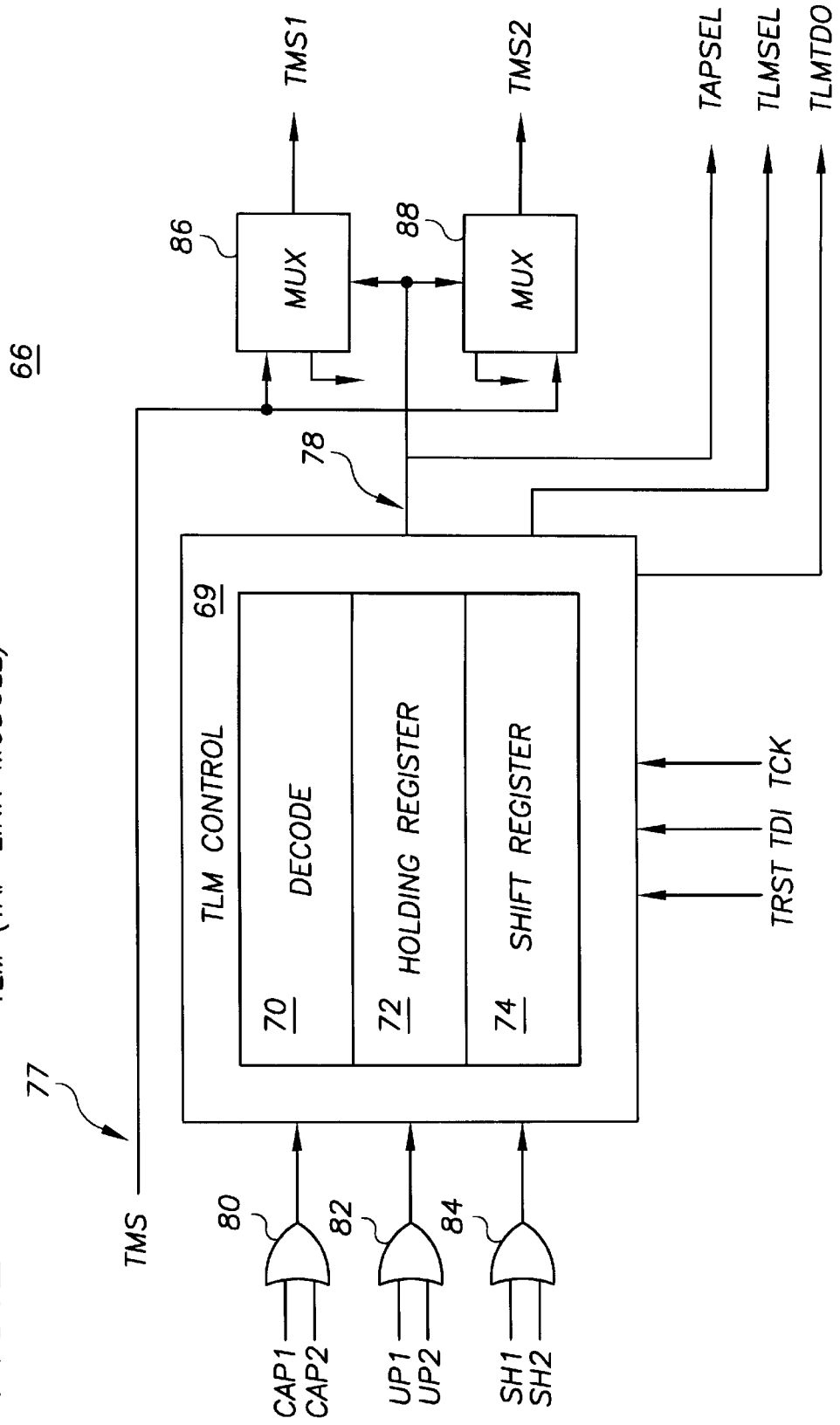
FIG. 2 illustrates a circuit arrangement for implementing the TAP link controller illustrated in FIG. 1, according to another example embodiment of the present invention.

In FIG. 2, a TAP link controller 66 is illustrated as an example circuit arrangement for implementing the functions described above in connection with the TLM 16 of FIG. 1. TAP link controller 66 of FIG. 2 includes a TLM control block 69 having function blocks depicted as a decode block 70, an update register 72 and a shift register 74. These central functional blocks 70, 72 and 74 respond to the JTAG-recommended interface signals, TDI (test input), TCK (test clock), TMS (test mode select) and the optional TRST (test reset) by processing the illustrated inputs (CAP, UP and SH) and therefrom generating the previously-discussed outputs through for the output control circuitry.

The decode block 70 provides control for both the incoming and outgoing signals. The decode block 70 decodes the inputs from the TAP controllers using three input-side multiplexers 80, 82 and 84, and processes these inputs to pass the appropriate output data via the output circuitry. The decode block 70 also provides select signal 78 to each of two output-side multiplexers 86 and 88. The multiplexers 86 and 88 pass the main TMS signal 77, as input into the TAP link controller 66, on as one of the individual TMS signals (in this example, TMS1 or TMS2) to the respective TAP1 or TAP2 controller. In one example embodiment, each of the multiplexers 86 and 88 receives this main TMS signal 77 as one input and its other input is connected to a power rail (e.g., VDD or ground).

According to the IEEE Standard 1149.1, when an IC powers up, at least one TAP controller should be enabled. Thus, if TAP1 (12 of FIG. 1) is enabled by default at power-up, the TMS1 of TAP1 is connected to TMS pin and the CAP1, SH1 and UP1 are selected. TAP link controller 66 of FIG. 2 generates TAPSEL and TLMSEL as outputs for controlling the TDOs from TAP1, TAP2 and TLM to the output pin.

More specifically, assuming that TAP link controller 66 is configured to recognize that TAP1 is enabled by default at power-up, the following actions ensue from power-up: (1) TMS1 is connected to the TMS access pin; (2) TMS2 is connected to a high logic whereby, the TAP2 controller is forced into reset condition; and (3) the TDI and TDO access pins are connected between the TDI and TDO of the TAP1 controller.

In the situation that control is being passed from TAP1 to TAP2, CAP1 selects the TAP1 external scan chain to the shift register 74; the contents from the update (or instruction) register 72 are fed into the shift register 74; and CAP1 also selects TDO from TLM to be connected to the TDO access pin through TLMSEL. Further, the SH1 provided by the TAP1 controller is used to shift a new instruction into the shift register 74 and to shift out the previous instruction simultaneously; and the UP1 provided by the TAP1 controller is used to latch in the new shifted data into the update (instruction) register 72.

A clock cycle later, the decode block 70 decodes the newly shifted instruction and gates off the TMS1 signal to either logic high or logic low, and gates the TMS pin to TMS2. Also, because TAP2 controller is now enabled (i.e., CAP2, UP2 and SH2 are now selected as inputs to the logic of the TAP link controller 66), this action changes the selection of the scan chain of the shift register 74 from TAP1 controller to TAP2 controller. Similarly, TAPSEL is also changed to properly select the TDO output from TAP2 to the TDO access pin of the IC. If TMS1 is driven to a high logic level, then the TAP1 controller automatically goes to the reset state in response to the clock. For implementations in which the TAP link controller 66 requires that the currently disabled TAP controller, such as TAP1 in this case, should be placed in the IDLE state rather than in the RESET state, then TMS1 should be driven to a logic level low.

The decode block 70 of FIG. 2 is conventional and is implemented according to the specific circuit application.

Figure 3:
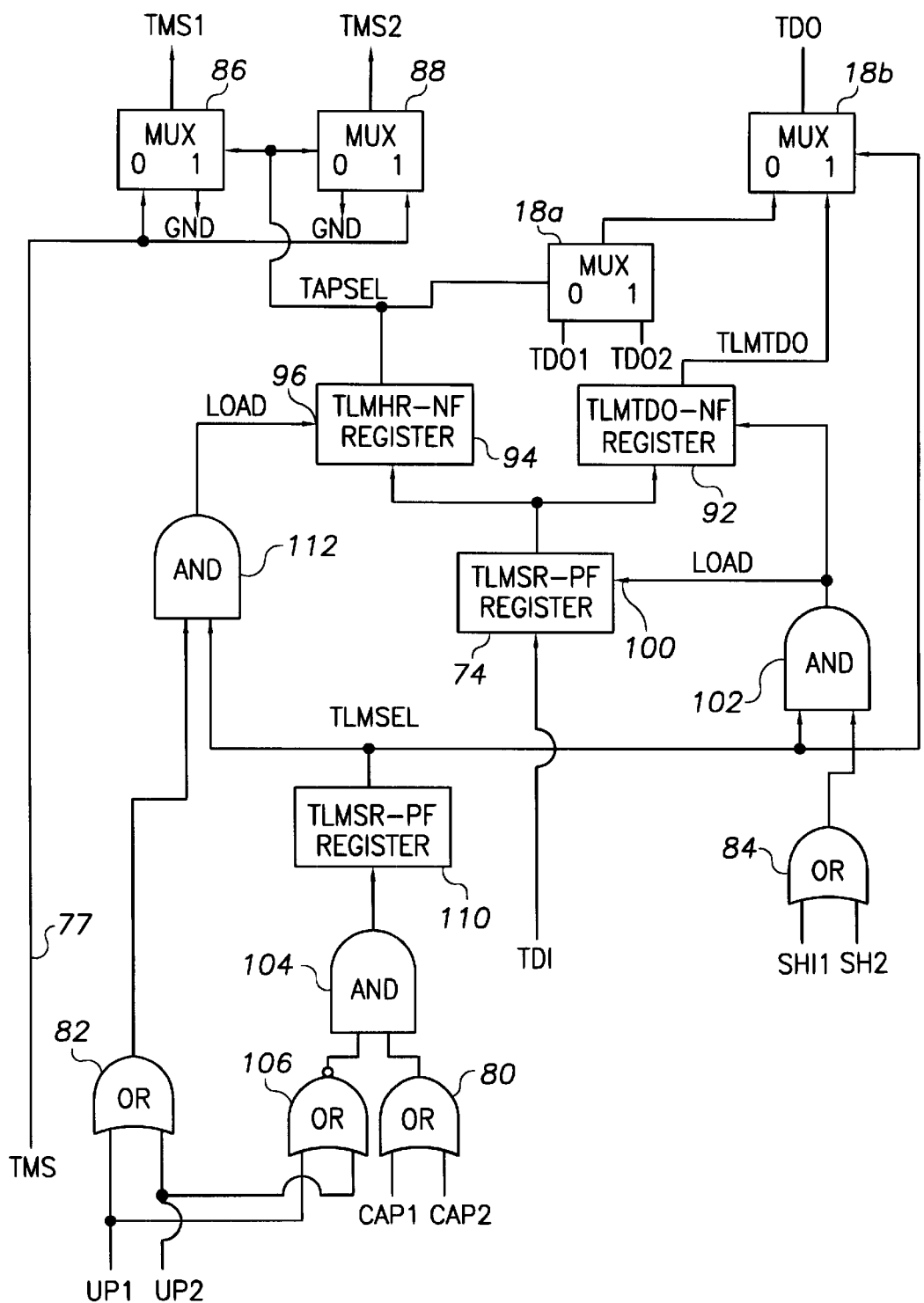
FIG. 3 is an expanded block diagram for an example TAP link control circuit, according to another aspect of the present invention and as may be used to implement part of the TAP link controller FIG. 2.

FIG. 3 illustrates an expanded example (functional) implementation of the TLM control block 69 and its surrounding blocks as previously shown in FIG. 2. Also depicted in FIG. 3 are the multiplexers 18a and 18b of FIG. 1. The shift register 74, which is exemplified as triggering on a positive edge "PF" (positive flop) of the TCK signal, shifts in the data (or instruction) present at TDI in response to a LOAD signal at input port 100. As this instruction is shifted into the shift register 74, the instruction previously held in the shift register 74 is shifted out and into a TLMTDO holding register 92 using the same LOAD signal but upon the next negative edge "NF" (negative flop) of the TCK signal. The TLMTDO holding register 92 generates the signal TLMTDO as previously discussed in connection with FIGS. 1 and 2. The LOAD signal is driven by an AND gate 102 in response to two conditions being satisfied, SH1 or SH2 from the corresponding TAP controllers being active, and the TLMSEL signal being active.

As represented by logic gates 80, 104 and 106, the TLMSEL signal becomes active in response to either CAP1 or CAP2 from the corresponding TAP controllers being active, and either UP1 or UP2 from the corresponding TAP controllers being inactive. In this manner, NOR gate 106 clears AND gate 104, and OR gate 108 sets AND gate 104. A TLMSEL holding register 110 is used to maintain the logic level until either the UP1 or UP2 signal becomes active, at which point TLMSEL holding register 110 is deactivated. This logic orientation maintains only one of the TAP controllers active at a given time.

The TLMSEL signal is also used to load a TLM holding register 94, which generates the signal TAPSEL as previously discussed in connection with FIGS. 1 and 2. An AND gate 112 activates this loading function via the load port 96 of the TLM holding register 94 in response to the TLMSEL signal being active and either UP1 or UP2 being active. The TCK and optional TRST signals for respectively clocking and resetting each of the illustrated registers, are not shown in FIG. 3.

Figure 4A:
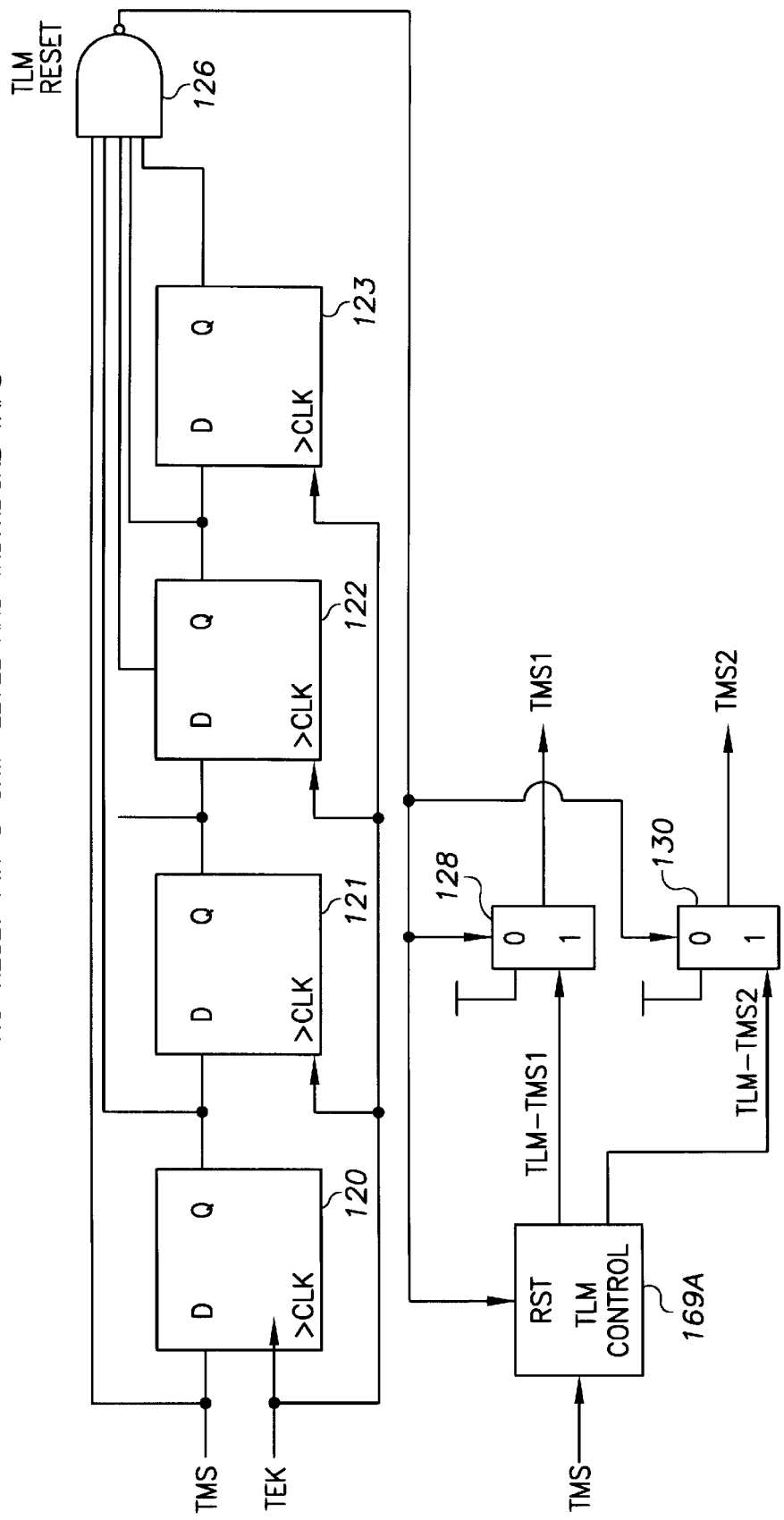

FIG. 4A illustrates a first example embodiment for resetting TAP link controller and the multiple TAP controllers illustrated and described as in connection with the above embodiments. This example embodiment is applicable to an IC implementation where there is no reset pin at the chip level and no reset port at the individual TAP controllers. The embodiment of FIG. 4A includes four cascaded D-type flip flops 120–123, an NAND gate 126 and an additional pair of multiplexers 128 and 130. The TMS signal is shifted through each of the cascaded D-type flip flops120–123, one flip flop at a time, as clocked by the TCK signal. Four TCK transitions after the TMS signal is present, the NAND gate 126 generates a TLM reset to the TLM control circuit 169A (relating to TLM control circuit 69 of FIG. 2), which recognizes that the TMS signal has propagated through all four flip flops. After one clock cycle to receive the output of the NAND gate 126, the TLM control circuit 169A then resets each of the TAP controllers (not shown) after the next four TCK high transitions. Thus, the TMS and TCK signals are used in the embodiment of FIG. 4A to reset the TLM and the associated TAP controllers in a total of nine TCK cycles, by using the TLM to reset the TAP controllers in sequence after the TLM recognizes the longest sequence of TMS that causes each TAP controller to reset.

FIG. 4B illustrates an alternative embodiment for resetting the TAP link controller and the multiple TAP controllers. This example embodiment is applicable to an IC implementation where there is no reset pin at the chip level but where there is a reset port at the individual TAP controllers. The embodiment of FIG. 4B includes similarly cascaded D-type flip flops 140–143, an NAND gate 146, and TAP controllers 150 and 152. The cascaded D-type flip flops 140–143 operate as described above in connection with the flip flops 140–143 of FIG. 4A. Four TCK transitions after the TMS signal is present, the NAND gate 146 generates a TLM reset to the TLM control circuit 169B, which recognizes that the TMS signal has propagated through all four flip flops. In the next clock cycle, the output of the NAND gate 146 is captured by the TLM, and the TLM control circuit 169B and each of the TAP controllers 150 and 152 are reset. Thus, without the availability of dedicated chip-level reset, the TMS and TCK signals are used in the embodiment of FIG. 4B to reset the TLM and the associated TAP controllers in a total of five TCK cycles.

Figure 4C:
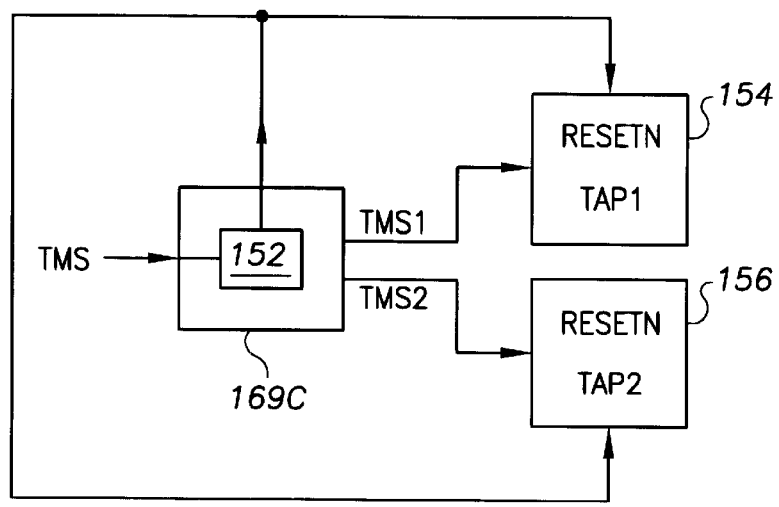

FIG. 4C illustrates an embodiment where reset of the TAP controllers is dependent on whether or not the TLM has received a reset. This embodiment is an alternative to the embodiment of FIG. 4B and is applicable where there is no reset pin at the chip level, and where a TAP controller 152 in the TLM control circuit resets 169C resets the individual TAP controllers 154 and 156. This embodiment is TLM state-dependent, whereas the embodiment of FIG. 4B is TLM state-independent. The TMS and TCK signals are used in the embodiment of FIG. 4C to reset the TAP controllers 154 and 156 in a total of four TCK cycles.

Figure 4D:
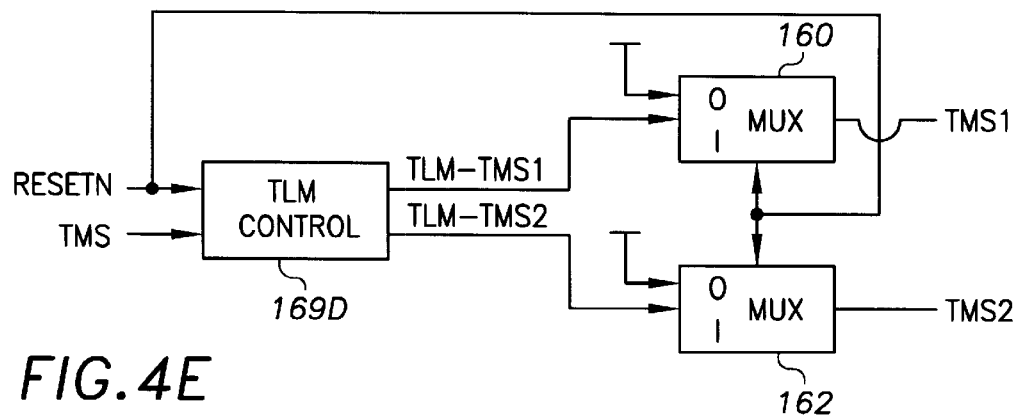

FIG. 4D illustrates an embodiment for resetting the TAP link controller and the multiple TAP controllers that is applicable where there is a reset pin at the chip level but where there is no reset port at the individual TAP controllers. In this embodiment, the TLM control circuit 169D recognizes reset and, in response, drives TLM-TMS1 and TLM-TMS2 signals high for four clock cycles for each TAP controller (not shown) to be reset. These TLM-TMS1 and TLMTMS2 TMS2 signals are passed through to a pair of multiplexers 160 and 162 that output the TMS1 and TMS2 signals to the respective TAP controllers in response to the multiplexers 160 and 162 concurrently recognizing the reset signal. The TAP controllers are reset in a total of four TCK cycles.

Figure 4E:
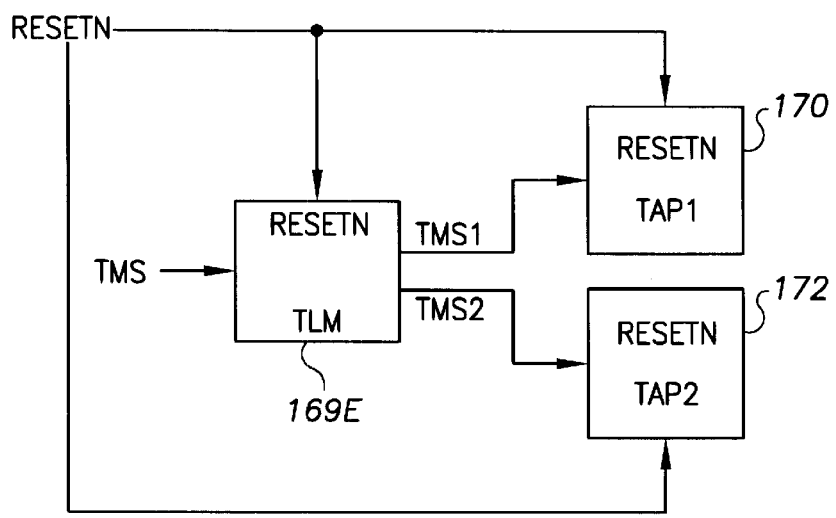

FIG. 4E illustrates an alternative embodiment for resetting the TAP link controller and the multiple TAP controllers for the situation in which there is a reset pin at the chip level and also for the individual TAP controllers. In this embodiment, the TLM control circuit 169E and the TAP controllers 170 and 172 are reset directly in response to the received reset signal.

FIG. 5 illustrates a flow chart of an example process for operating the example arrangement of FIGS. 1 and 2. The process begins at block 200 where the TLM determines if either CAP1 or CAP2 is active. If neither of these two signals is active, flow proceeds from block 200 to block 202 where the TLM selects one of the TAP controllers (via TMS1 or TMS2) and its corresponding output (TDO1 or TDO2). This selection is based on the state of TAPSEL, for example, as generated using the logic illustrated and discussed in connection with FIG. 3. Flow then returns from block 202 to block 200.

In response to the TLM determining that either CAP1 or CAP2 is active, flow proceeds from block 200 to block 204 where the TLM selects the signal TLMTDO, via TLMSEL and the above-described output circuitry, as the output for the TDO signal. Flow proceeds from block 204 to block 206.

At block 206, the TLM determines if either SH1 or SH2 is active. If neither of these two signals is active, the TLM waits for a change in this condition. In response to the TLM determining that either SH1 or SH2 is active, flow proceeds from block 206 to block 208 where the TLM updates its internal shift register (74 of FIG. 3) by shifting the TDI signal in and shifting out the TDO signal. The TDO signal is shifted out via the TLMTDO register (92) as discussed in connection with FIG. 3. Flow then proceeds from block 208 to block 210.

At block 210, the TLM determines if either UP1 or UP2 is active. If neither of these two signals is active, flow returns to block 206. In response to the TLM determining that either UP1 or UP2 is active, flow proceeds from block 210 to block 212 where the TLM shifts data from its internal shift register (74 of FIG. 3) into the TLM holding register 94. As referred to above in connection with FIG. 3, the TLMSEL holding register 110 is used to maintain the logic level until either the UP1 or UP2 signal becomes active. Flow then proceeds from block 212 to block 214 where the decode block (70 of FIG. 2) decodes the new instruction as is conventional.

The various embodiments described above are provided by way of illustration only and are not intended to limit the invention. Those skilled in the art will readily recognize various modifications and changes that may be made to the present invention. For example, it is apparent that the circuitry shown is readily implemented using conventional logic circuits and implementation tools, including but not limited to HDL approaches and programmed microprocessor approaches. Such logic circuits and implementation tools permit, for example, the illustrated cascaded D-type flip flops of FIGS. 4A and 4B to be implemented as either flip flops or binary counters. Changes such as these that do not strictly follow the example embodiments and applications illustrated and described herein do not depart from the scope of the present invention, which is set forth in the following claims.

What is claimed is:

1. For use in a multi-core IC having a limited number of access pins for selecting functions internal to the IC, a circuit control arrangement, comprising:

multiple test-access port (TAP) controllers, each TAP controller configured and arranged to couple to a common interface, to receive input signals indicating if the TAP controller is enabled, and to generate status and test signals; and an output control circuit including a TAP link module, the output circuit being configured and arranged to output one of the test signals respectively provided by the multiple TAP controllers in response to each of the multiple TAP controllers and the TAP link module; wherein the TAP link module includes an output coupled to the input of each multiple TAP controller, and is configured and arranged to provide the input signals and to maintain one of the TAP controllers enabled at a given time.

2. A circuit control arrangement, according to claim 1, wherein the TAP link module is further configured and arranged to respond to the status signals provided by the multiple TAP controllers by transitioning enablement between the TAP controllers and to signal which one of the test signals respectively provided by the multiple TAP controllers to output.

3. A circuit control arrangement, according to claim 1, wherein the common interface is compatible with an IEEE JTAG recommendation, and further including an external scan chain support in at least one of the TAP controllers.

4. A circuit control arrangement, according to claim 1, wherein each TAP controller is further configured and arranged to receive a test mode select input signal.

5. A circuit control arrangement, according to claim 1, wherein the status signal generated by each TAP controller includes at least two of the following signals: a clock signal useful for sampling data into the TAP controller; a shift clock useful for shifting data into the TAP controller; an update clock useful for indicating a recent status of the controller.

6. A circuit control arrangement, according to claim 1, wherein the common interface is compatible with an IEEE JTAG recommendation, and wherein the status signal generated by each TAP controller includes: a clock signal useful for sampling data into the TAP link module; a shift clock useful for shifting data into the TAP link module; an update clock useful for indicating a recent status of the TAP link module.

7. A circuit control arrangement, according to claim 1, wherein the output control circuit includes at least one multiplexer having a select input responsive to the link module and having feed inputs responsive to the test signals generated by the multiple TAP controllers.

8. A circuit control arrangement, according to claim 1, wherein the link module includes at least one of: a discrete register, combinatorial logic, and a TAP controller.

9. A circuit control arrangement, according to claim 1, wherein the input and test signals respectively correspond to TMS (test mode select) and TDO (test output signal) consistent with an IEEE JTAG recommendation.

10. A circuit control arrangement, according to claim 9, wherein the common interface includes a TDI (test input) and a TCK (test clock) consistent with the IEEE JTAG recommendation.

11. A circuit control arrangement, according to claim 1, wherein the common interface includes a TRST (test reset) consistent with the IEEE JTAG recommendation, and wherein in response to a reset signal, one of the TAP controllers is enabled.

12. A circuit control arrangement, according to claim 11, wherein the link module provides a reset using TCK and TMS and said reset disables the remaining TAPs except said one of the TAP controllers that is enabled.

13. A circuit control arrangement, according to claim 1, further including a reset circuit that resets a TAP controllers and a TLM using TCK and TMS and without using a separate reset input signal to the IC.

14. A circuit control arrangement, according to claim 13, wherein the reset circuit is configured and arranged to reset the TAP controllers and the TLM by having the TLM reset each TAP controller, after the TLM recognizes the longest sequence of TMS that causes each TAP controller to reset.

15. A circuit control arrangement, according to claim 13, wherein the reset circuit is configured and arranged to reset the TAP controllers and the TLM by using a reset signal to each TAP controller and to the TLM, and wherein the reset circuit is further configured and arranged to generate the reset signal in response to the recognizing the longest sequence of TMS that causes each TAP controller to reset.

16. A circuit control arrangement, according to claim 13, wherein the reset circuit is configured and arranged to reset the TAP controllers and the TLM, by having the TLM generate a reset signal to each TAP controller and by having the TLM control each TAP controller using a corresponding TMS input to each respective TAP controller.

17. A circuit control arrangement, according to claim 1, further including a reset circuit that resets a TLM using a separate reset input signal to the IC, and wherein the reset circuit includes means for resetting the TAP controllers in response to the separate reset input signal to the IC and TMS signals generated for each respective TAP controller.

18. A circuit control arrangement, according to claim 1, further including a reset circuit that resets a TLM and each TAP controller using a separate reset input signal to the IC.

19. For use in a multi-core IC having a limited number of access pins for selecting functions internal to the IC, a circuit control arrangement, comprising:

multiple test-access port (TAP) means, each TAP means for coupling to a common interface, receiving input signals indicating if the TAP means is enabled, and generating status and test signals;

an output means, responsive to each of the multiple TAP means, for outputting one of the test signals respectively provided by the multiple TAP means; and a TAP link means, coupled to the input of each multiple TAP means, for providing the input signals and for maintaining one of the TAP means enabled at a given time.

20. A circuit control arrangement, according to claim 19, wherein the common interface is compatible with an IEEE JTAG recommendation.

21. A circuit control arrangement, according to claim 19, wherein the output means outputs the test signals respectively provided by the multiple TAP controllers using a selected same one of the limited number of access pins.

22. A circuit control arrangement, according to claim 19, wherein the output means outputs the test signals respectively provided by the multiple TAP controllers using different ones of the limited number of access pins.

23. For use in a multi-core IC having a limited number of access pins for selecting functions internal to the IC, a method for controlling multiple test-access port (TAP) controllers coupled to a common interface, comprising:

at each of the multiple TAP controllers, receiving input signals, determining if the TAP controller is enabled, and generating status and test signals;

in response to each of the multiple TAP controllers, outputting one of the test signals respectively provided by the multiple TAP controllers; and at the input of each of the multiple TAP controllers, providing the input signals and maintaining one of the TAP controllers enabled at a given time.

24. A method for controlling multiple test-access port (TAP) controllers coupled to a common interface, according to claim 23, further including, in response to the status signal, transitioning enablement between the TAP controllers and signaling which one of the test signals respectively provided by the multiple TAP controllers to output.

25. A method for controlling multiple test-access port (TAP) controllers coupled to a common interface, according to claim 23, wherein outputting one of the test signals respectively provided by the multiple TAP controllers includes using a selected same one of the limited number of access pins for outputting the test signals from the multiple TAP controllers.

26. For use in a multi-core IC having a limited number of access pins for selecting functions internal to the IC, a circuit control arrangement, comprising:

multiple test-access port (TAP) controllers, each TAP controller configured and arranged to couple to a common interface, to receive input signals indicating if the TAP controller is enabled, and to generate status and test signals;

a TAP link module coupled to the input of each multiple TAP controller, and configured and arranged to provide the input signals and to maintain one of the TAP controllers enabled at a given time, the TAP link module including:

an input multiplexer arrangement for selecting a set of signals from the one of the TAP controllers that is enabled, an output multiplexer arrangement for feeding a TMS signal to the one of the TAP controllers that is enabled; and an output control circuit responsive to each of the multiple TAP controllers and to the TAP link module, the output control circuit configured and arranged to output one of the test signals respectively provided by the multiple TAP controllers.

27. A circuit control arrangement, according to claim 26, wherein the TAP link module includes a shift register adapted to shift data indicative of executable instructions, an instruction register adapted to store the instructions for execution, and a decode block adapted to decode the instructions.

28. A circuit control arrangement, according to claim 26, wherein the TAP link module includes shift means for shifting data indicative of executable instructions, storage means for storing the instructions for execution, and decode means for decoding the instructions.

* * * * *